United States Patent
Haeusler

(10) Patent No.: US 8,470,679 B2
(45) Date of Patent: Jun. 25, 2013

(54) SEMICONDUCTOR DEVICE INCLUDING A DEEP CONTACT AND A METHOD OF MANUFACTURING SUCH A DEVICE

(75) Inventor: Alfred Haeusler, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 61 days.

(21) Appl. No.: 12/794,883

(22) Filed: Jun. 7, 2010

(65) Prior Publication Data
US 2010/0283119 A1    Nov. 11, 2010

(30) Foreign Application Priority Data
May 8, 2009    (DE) .................. 10 2009 020 429

(51) Int. Cl.
*H01L 21/331*    (2006.01)
(52) U.S. Cl.
USPC ............... 438/361; 438/348; 257/E29.02
(58) Field of Classification Search
USPC ................ 438/361, 348; 257/E29.02
See application file for complete search history.

(56) References Cited

U.S. PATENT DOCUMENTS

| 4,442,449 A * | 4/1984 | Lehrer et al. ............... 257/741 |
| 4,933,739 A * | 6/1990 | Harari ........................ 257/621 |
| 5,003,365 A | 3/1991 | Havemann et al. |
| 5,034,338 A * | 7/1991 | Neppl et al. ................ 438/207 |
| 5,358,884 A | 10/1994 | Violette |
| 5,614,750 A | 3/1997 | Ellul et al. |
| 2009/0152733 A1 * | 6/2009 | Montanini et al. ......... 257/773 |

FOREIGN PATENT DOCUMENTS
EP    1298718 A2    4/2003

* cited by examiner

*Primary Examiner* — Stephen W Smoot
*Assistant Examiner* — Vicki B Booker
(74) *Attorney, Agent, or Firm* — Jacqueline J. Garner; Wade J. Brady, III; Frederick J. Telecky, Jr.

(57) ABSTRACT

A semiconductor device includes a buried layer and a deep contact for providing a low resistive connection to the buried layer. The deep contact is formed by doped polycrystalline silicon. A method of manufacturing a semiconductor device and a deep contact for providing a low resistive connection to the buried layer, with the steps of forming a buried layer, providing an active region adjacent the buried layer and forming a deep contact for providing a low resistive connection to the buried layer by patterning a contact shape for the deep contact on an upper surface of the active region, removing part of the active region underneath the contact shape to create a deep contact cavity. Subsequently a polycrystalline silicon layer for filling the deep contact cavity is deposited and doped.

7 Claims, 3 Drawing Sheets

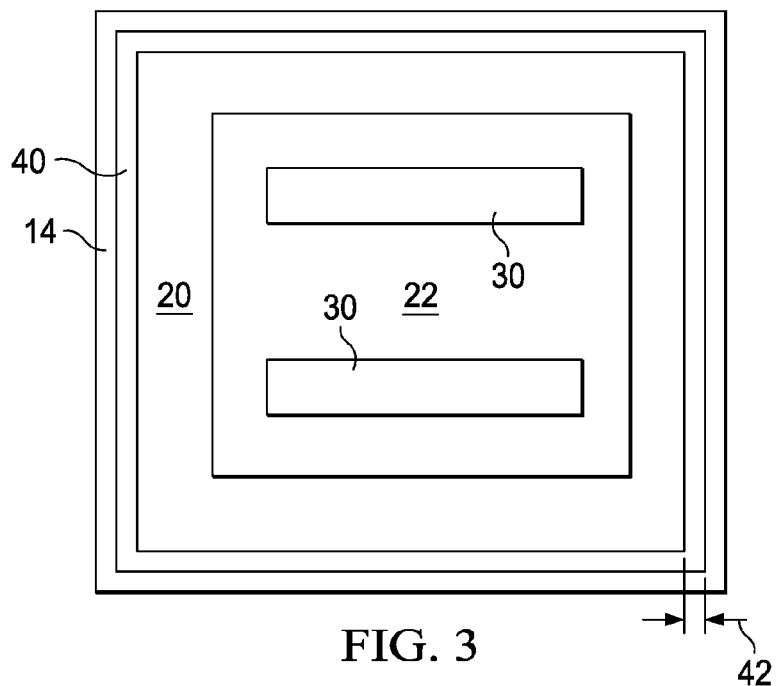
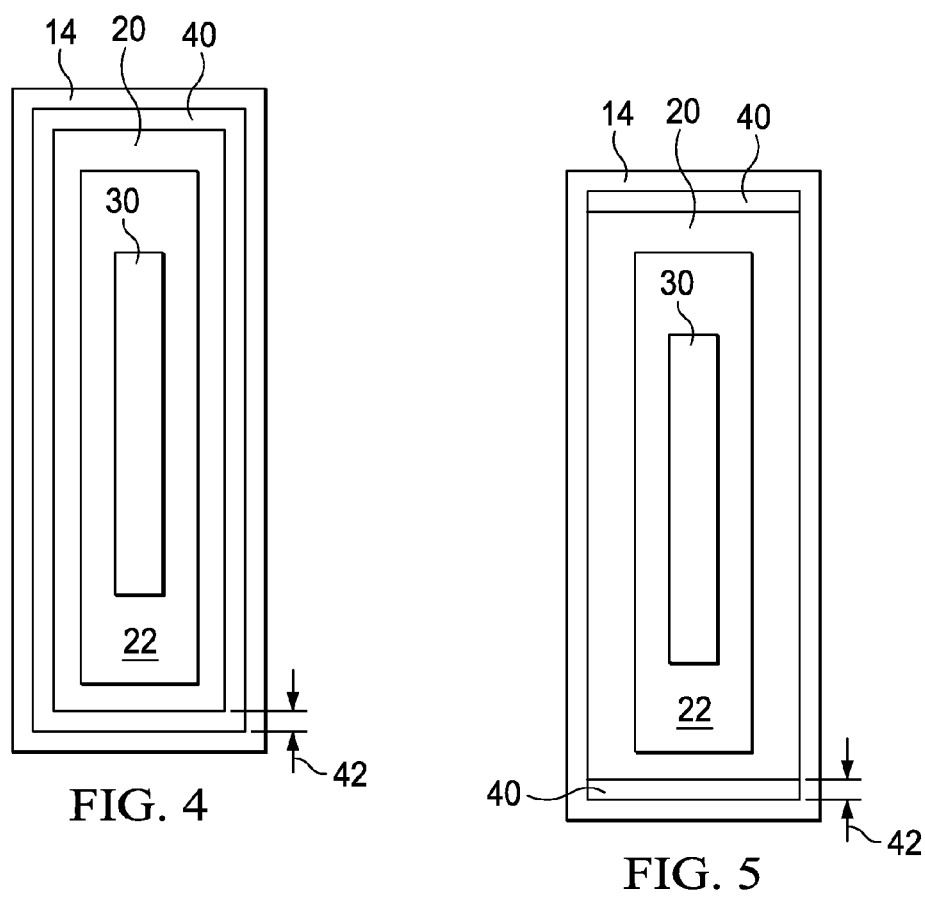

SEMICONDUCTOR DEVICE INCLUDING A DEEP CONTACT AND A METHOD OF MANUFACTURING SUCH A DEVICE

FIELD OF THE INVENTION

The present invention generally relates to a semiconductor device comprising a buried layer and a method of manufacturing such a device.

BACKGROUND

It is well-known in the state of the art to manufacture semiconductor devices, for example silicon integrated circuits, which comprise a buried layer. According to the application, the buried layer must be operable to be electrically contacted through an overlaying layer.

A bipolar transistor having a collector formed by a buried layer is an example. The buried layer is usually covered by an epitaxially grown layer of silicon separating the collector from the base of the transistor. The epitaxially grown silicon layer is limited laterally by trenches to form a silicon well.

The collector formed by the buried layer is to be electrically contacted on the upper surface of the device. Therefore, a deep contact providing an electrical connection between the buried layer and the upper surface is needed. This deep contact must have a low series resistance. In the state of the art, part of the silicon well is used to provide electrical contact between the buried collector and the upper surface of the device.

In order to obtain a low resistance, the series resistance of the deep contact may be reduced by reducing the depth at which the buried layer is buried or in other words by reducing the thickness of the epitaxial layer deposited on top of the buried layer. But a required minimal breakdown voltage for the vertical junction breakdown behavior may require a minimal epitaxial thickness. Therefore, the epitaxial thickness cannot always be reduced sufficiently. An example for a required thickness in BICMOS technology (bipolar and CMOS transistors integrated in the same device) lies at about 5 µm.

Another possibility for reducing the series resistance is to use a larger contact area, which means a greater circuit surface needed for a transistor. This is contrary to the advancements in technology in terms of scaling vertical and lateral dimensions.

The resistivity of silicon can be influenced by doping the silicon. Well known dopants comprise arsenic and boron, but other dopants may be used as well. With an increasing dopant concentration, the resistivity decreases. The doping must be uniform in order to have a low series resistance. Doping a thick epitaxial silicon layer requires high implants of the order of several MeV implants to get uniform contact diffusion doping across the epitaxial depth. As there is only a limited lateral space, only a limited amount of doping can be implanted without generating massive implant damage and of course without residual implant damage even after optimized anneal sequences.

Thus, in the state of the art, the further lateral scaling of bipolar transistors is limited by the increasing contact resistance and/or increasing the vertical breakdown voltage is limited by the contact resistance.

SUMMARY

The invention provides a semiconductor device having a buried layer on a semiconductor substrate and a deep contact for providing a low resistive connection to the buried layer. The deep contact is formed by doped polycrystalline silicon. The deep contact provides a low resistive connection to the buried layer passing through an overlaying layer which may be an epitaxially grown layer to a surface of the overlaying layer.

The use of polycrystalline silicon has the advantage of a high dopant diffusion along the grain boundaries of the silicon. By controlling the grain size, the dopant diffusion can be influenced.

Polycrystalline silicon has the further advantage of being an ideal material in terms of stress conditions to avoid defect generation. A low resistive deep contact allows the use of the semiconductor device in a wide range of applications. The overlaying layer can be thicker and therefore high voltage applications are possible.

A further advantage of using polycrystalline silicium as material for the deep contact is the lower temperatures needed for a uniform doping compared to doping an epitaxially grown silicium layer.

Further embodiments are included in the dependent claims. Advantageously, the semiconductor device comprises a bipolar transistor and the buried layer forms a collector of the transistor. Thus, the deep contact forms an electrical contact from the collector to the surface having a low resistance.

In an aspect of the invention, the semiconductor device comprises a shallow trench for isolating an active zone of the bipolar transistor, the shallow trench region being adjacent to the buried layer and surrounding the active zone. A deep trench isolation extends to below the buried layer and surrounds the shallow trench region. The deep contact may then advantageously be formed between the shallow trench region and the deep trench isolation.

The deep contact may be tailored to the needs of the application. In an embodiment, the deep contact surrounds the shallow region. This will allow the flow of a high current.

The invention further provides a method of manufacturing a semiconductor device comprising a buried layer and a deep contact for providing a low resistive connection to the buried layer. The method comprises the steps of providing a buried layer and providing an active region adjacent the buried layer. A contact shape for the deep contact is patterned on an upper surface of the active region. Part of the active region underneath the contact shape is removed to create a deep contact cavity and subsequently a polycrystalline silicon layer is deposited and doped for filling the deep contact cavity.

In an embodiment a desired lateral contact shape is patterned on the upper surface of an active region overlaying the buried layer and which may be formed from epitaxial silicon. Etching is performed, which removes the epitaxial silicon under the contact shape leaving a contact cavity. Subsequently, a layer of polycrystalline silicon is deposited and doped. The polycrystalline layer is thus filling the deep contact. Advantageously, the deposited polycrystalline layer has a thickness of 1.5 times the width of the deep contact. Thus, it is ascertained that the deep contact cavity is completely filled.

The polysilicon may be doped with a box like dopant profile. This may be achieved by doping the polycrystalline silicon in situ.

In an embodiment of the invention the polycrystalline is doped by implanting dopant sources and the dopant is then thermally distributed.

In an aspect of the invention, the polycrystalline silicon is deposited subsequently in several layers. The first layer is deposited, subsequently doped and the dopant thermally distributed before a second layer of polycrystalline silicon is deposited, subsequently doped and the dopant terminally distributed.

In an illustrative embodiment the layer of polycrystalline silicon further comprises Germanium and/or Carbon which further increases the diffusivity of the dopant.

BRIEF DESCRIPTION OF DRAWINGS

Further advantages and characteristics of the invention ensue from the description below of an example embodiment, and from the accompanying drawings, in which:

FIG. 3 is a simplified top view onto the upper surface of a bipolar transistor according to the invention comprising two emitters;

FIGS. 4 and 5 are simplified top views onto an upper surface of a bipolar transistor according to the invention.

DETAILED DESCRIPTION OF AN EXAMPLE EMBODIMENT

Figure 1:
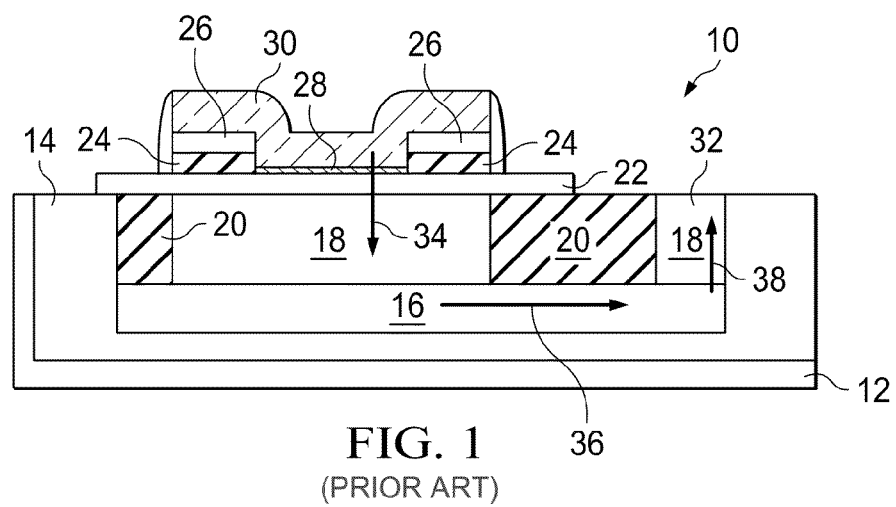
FIG. 1 is a simplified schematic cross-section of a bipolar transistor according to the state of the art.

FIG. 1 shows a conventional PNP transistor device 10. On a substrate 12, a buried layer 16 is formed. On top of the buried layer 16 an active region 18 is formed. Active region 18 is a substantially undoped or lightly doped region. Active region 18 may be formed by any of a variety of techniques well known to those skilled in the art, such as epitaxial growth. The buried layer forms the collector of the bipolar transistor 10. A deep trench isolation 14 is formed, which separates electrically the transistor from neighboring circuitry for example other transistors. Advantageously, an SOI (silicon on insulator) wafer is used and the deep trench isolation goes down to the insulator. In the active region, a shallow trench isolation 20 is formed. Shallow trench isolation is a known technique in the semiconductor technology. For forming the shallow trench isolation, part of the active region is removed, for example, the active region may be epitaxial silicon which is etched away. The cavity formed in this way is filled, for example, by silicon oxide to separate different active transistor regions. The separated active region is sometimes called a silicon well.

A base layer 22 lies on top of the silicon well. The base layer 22 IS formed on top of the active region and may overlap the deep trench isolation 14. The base layer 22 is, for example, grown epitaxially and may be at least partially polycrystalline. On top of the base layer 22 an oxide layer 24 and a nitrite layer 26 (silicon nitrite $Si_3N_3Ni_4$) are formed. An area of the nitrite layer 26 and the oxide layer 24 is etched away to form a window to base layer 22. In the window, an interface layer 28 is formed. Finally, an emitter 30 is formed by depositing a polycrystalline silicon layer.

Collector 16 is buried. To contact collector 16 electrically from the upper surface of the transistor device, part of the active region 18, designated 32, is used as a deep contact, separated from the active transistor region by the shallow trench region 20.

It is well-known in the state of the art to dope the different silicon layers to form a PNP or an NPN transistor.

In operation, when appropriate voltages are applied to emitter, base and collector of transistor 10, a current will flow from the emitter 30 along the direction of an arrow 34 to the buried layer 16 forming the collector, in the buried layer 16 along the direction of an arrow 36 and through the epitaxial layer 18, in the deep contact 32 along the direction of an arrow 38 to the upper surface. The thickness of epitaxial layer 18 is chosen to have a resistance sufficient to prevent vertical voltage breakdown for a given voltage between emitter 30 and buried collector 16.

The shallow trench isolation 20 separates the active area between base 22 and collector 16 from the deep contact 32, which allows the collector 16 to be contacted from the upper surface through the epitaxial layer 18. The deep contact 32 should have a series resistance as low as possible for the best performance of the transistor. In the state of the art, this limits the possibility of scaling the width of the contact area. Doping of this part is very difficult to achieve by implanting without damaging the structure.

Figure 2:
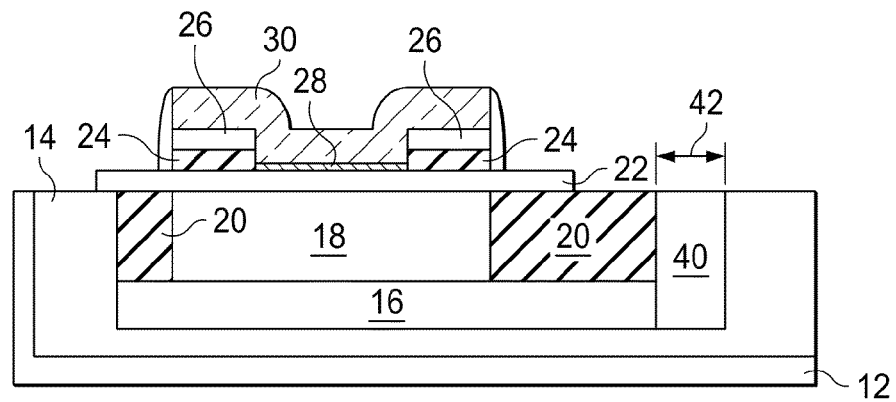
FIG. 2 is a simplified schematic cross-section of a bipolar transistor according to the invention.

FIG. 2 shows an example transistor according to the invention. The structure is roughly the same as the one of the transistor shown in FIG. 1. Equivalent parts are designated with the same reference numbers.

Figure 6:
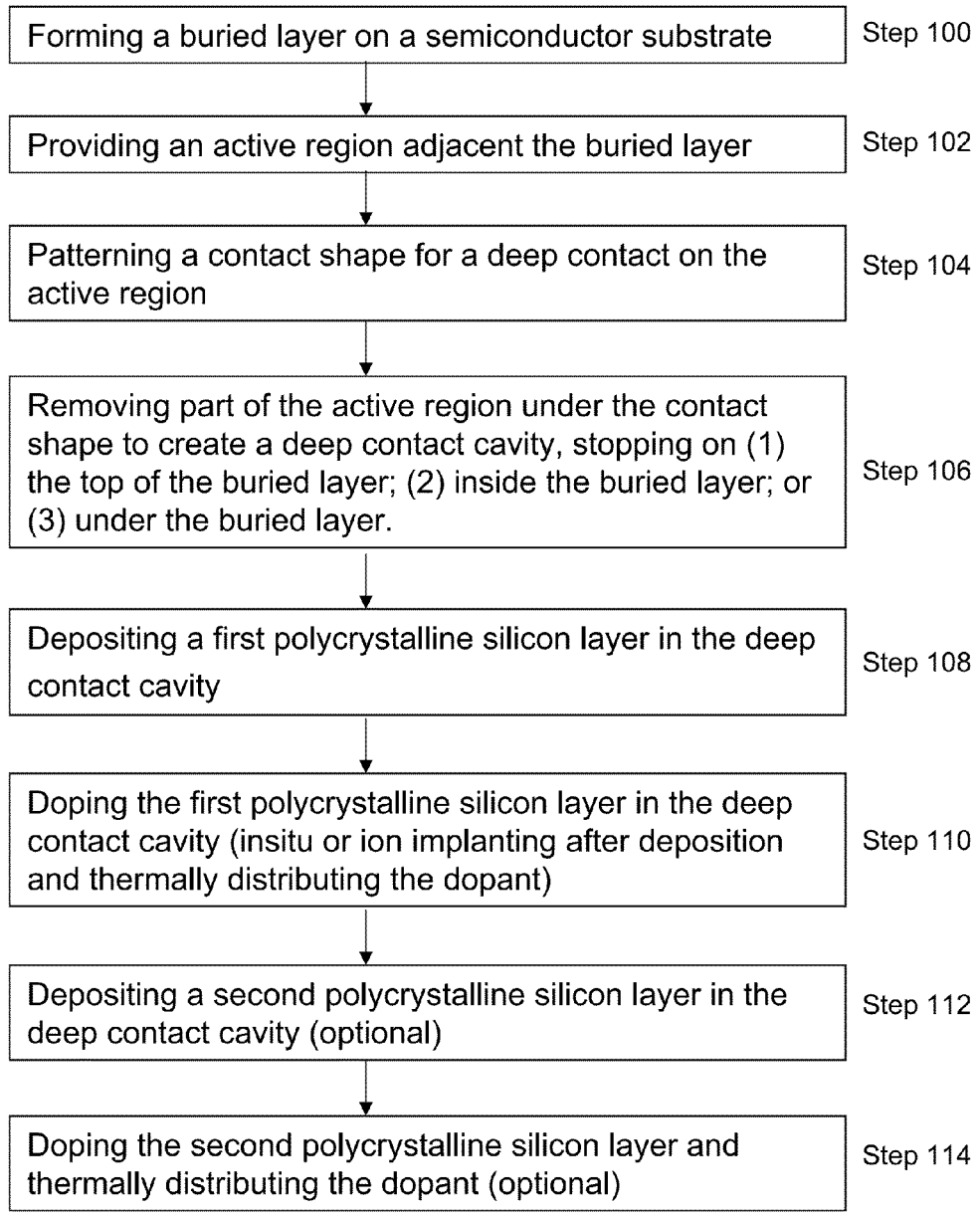
FIG. 6 is a process flow diagram of a method of fabricating an integrated circuit having a deep cavity contact according to the invention.

The transistor is manufactured as follows (referring to FIG. 6). On a substrate 12 a buried layer 16 is formed by known techniques (step 100). Adjacent to the buried layer 16 an active region 18 is formed (step 102) as explained with reference to FIG. 1. In one embodiment, active region 18 is an epitaxial grown silicon layer. A shallow trench region 20 is formed in the active region 18 extending down to the buried layer 16. As also known in the state of the art, a deep trench 14 is formed by etching the silicon and filling the trench cavity for example with an oxide. Afterwards, the surface is planarized. In an aspect of the invention, a silicon on insulator technique is used and the deep trench isolation extends down to the insulating layer which may be an oxide. Then a deep contact shape may be patterned on the active region (step 104). For patterning of the shape a conventional resist may be used.

After patterning the desired contact shape for deep contact 40, part of the active region 18 underneath the contact shape is removed (step 106). The deep contact 40 has a contact width 42. In an aspect of the invention, the epitaxial layer 18 is etched away by known etching techniques. The etching may be stopped on top of the buried layer 16, so that a structure similar to the one shown in FIG. 1 is achieved.

In another embodiment, the etching will also etch away parts of buried layer 16 underneath the contact shape. In a further embodiment shown in FIG. 2, the etching is stopped after etching away the complete buried layer.

After the etching, the resist used for patterning the contact shape is removed. There is now a contact cavity etched into the silicon well 18. Native oxide can now be removed from the silicon surface. In the next step, a layer of polycrystalline silicon is deposited. As well known by a person skilled in the art, the layer of polycrystalline silicon will form on the surface of the silicon well, the deep trench isolation and on the border walls of the contact cavity. The thickness of the layer of polycrystalline silicon is preferably 1.5 times the collector contact shape width. Thus, it is ensured that the layer growing on the border walls will completely fill the contact cavity.

It follows a step of etching back or polishing away excessive polycrystalline silicon. Thus, only the polycrystalline silicon in the deep contact 40 will remain.

The deep contact may be operable to electrically contact the buried collector. Only a single mask is needed for the deep contact.

To get a low resistivity, the polycrystalline silicon must be doped. Different methods of doping may be used. The polycrystalline silicon may be doped in situ and it is also possible to dope the polycrystalline silicon by implanting doping sources and to distribute the dopant in a subsequent thermal annealing process.

To obtain a uniform dopant distribution, it is also possible to deposit a first layer of polycrystalline silicon (step 108), which does not fill completely the contact cavity, then dope the deposited polycrystalline silicon (step 110) and thermally distribute the dopant. Afterwards, a second layer of polycrystalline silicon may be deposited (step 112), subsequently doped, and the dopant thermally distributed (step 114). These steps may be repeated until the contact cavity is completely filled.

In polycrystalline silicon the dopant diffuses along the grain boundaries during the doping process. In controlling the grain size of the polycrystalline structure, the diffusivity of the dopant can be controlled.

Using a polycrystalline deep contact has the advantage, that only a limited temperature from up to about 900° C. or a spike anneal with very short anneal time (lowest possible temperature budgets) is needed for the doping/dopant activation process. This is especially important in advanced analog technologies where bipolar transistors and CMOS transistors are realized on one wafer, in one circuit.

With a deep contact filled with polycrystalline silicon according to the invention, it is possible to manufacture CMOS transistors which tolerate 40V supply voltage and at the same time realize vertical contact systems which have a vertical contact sheet resistance in the range of 10 kiloohms/sq. The epitaxial layer 18 may be of a thickness of 5 μm. In advantageous embodiments the dopant diffusivity may be further increased by adding Germanium or Carbon to the polycrystalline silicon layer.

Different possibilities for the collector contact shape are shown in FIGS. 3 to 5. FIG. 3 shows a top view onto the upper surface of a bipolar transistor according to the invention with a two emitter structure. Two emitter structures 30 are formed on a base area 20 which is surrounded by a shallow trench 20. The shallow trench area is surrounded by the deep contact 40 having a contact width 42. The deep contact is surrounded by the deep trench isolation 14. Preferably, the deep collector contact 40 is built just after the deep trench isolation 14. Thus, only a single mask level must be added to the manufacturing process. In the aspect of the invention shown in FIG. 3, the deep contact 40 lies between shallow trench 20 and deep trench isolation 14.

FIG. 4 and FIG. 5 show top views of transistors each with a single emitter 30. Emitter 30 is surrounded by a base area 22 which is surrounded by a shallow trench area 20.

In FIG. 4 the contact area 40 with a contact width 42 surrounds the shallow trench area 20, whereas in FIG. 5, there are two separated contact areas 40. In both embodiments, the whole structure is surrounded by a deep trench isolation 14. It should be understood that these are only examples of advantageous collector contact shapes. The collector contact shape can be varied widely and depends on component characteristics and can easily be tailored for each application need. The contact width 42 does not have to be uniform but the thickness of the polycrystalline layer filling up the deep contact 40 should be adapted to the greatest width.

FIG. 3 shows a preferred structure for a device which is optimized for high current. FIGS. 4 and 5 show structures which are optimized for a minimal size occupied by the device. Thus, a high component packing density is achieved.

Although the invention has been described hereinabove with reference to a specific embodiment, it is not limited to this embodiment and no doubt further alternatives will occur to the skilled person that lie within the scope of the invention as claimed.

The invention claimed is:

1. A method of manufacturing a semiconductor device comprising the steps of:
    forming a buried layer on a semiconductor substrate;
    providing an active region adjacent the buried layer;
    forming a deep contact for providing a low resistive connection to the buried layer by:
        patterning a contact shape for the deep contact on an upper surface of the active region;
        removing part of the active region underneath the contact shape to create a deep contact cavity; and subsequently
        depositing a first polycrystalline silicon layer in the deep contact cavity;
        doping the first polycrystalline silicon layer;
        depositing a second polycrystalline silicon layer in the deep contact cavity; and
        doping the second polycrystalline silicon layer.

2. The method of claim 1, wherein the first polycrystalline silicon is in situ doped.

3. The method of claim 1, wherein the first polycrystalline silicon layer is doped by first implanting dopant sources and then thermally distributing the dopant.

4. The method of claim 1, wherein the step of removing part of the active region is stopped on top of the buried layer.

5. The method of claim 1, wherein the step of removing part of the active region is stopped inside the buried layer.

6. The method of claim 1, wherein the step of removing part of the active region is stopped under the buried layer.

7. The method of claim 1, wherein the first layer of polycrystalline silicon further comprises germanium and/or carbon.

* * * * *